United States Patent
Yazaki et al.

(10) Patent No.: US 10,320,356 B2
(45) Date of Patent: Jun. 11, 2019

(54) LC COMPOSITE ELECTRONIC COMPONENT, AND MOUNTING STRUCTURE FOR LC COMPOSITE ELECTRONIC COMPONENT

(71) Applicant: Murata Manufacturing Co., Ltd., Nagaokakyo-shi, Kyoto-fu (JP)

(72) Inventors: Hirokazu Yazaki, Nagaokakyo (JP); Toshiyuki Nakaiso, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/944,938

(22) Filed: Apr. 4, 2018

(65) Prior Publication Data
US 2018/0226935 A1    Aug. 9, 2018

Related U.S. Application Data

(63) Continuation of application No. PCT/JP2016/080160, filed on Oct. 12, 2016.

(30) Foreign Application Priority Data

Oct. 16, 2015    (JP) .................................. 2015-204732

(51) Int. Cl.
*H03H 7/01*    (2006.01)
*H03H 1/00*    (2006.01)
(Continued)

(52) U.S. Cl.
CPC ....... *H03H 7/0115* (2013.01); *H01F 17/0013* (2013.01); *H01F 27/2804* (2013.01);
(Continued)

(58) Field of Classification Search
CPC . H03H 2001/0085; H03H 7/0115; H03H 1/00
(Continued)

(56) References Cited

U.S. PATENT DOCUMENTS 5,416,356 A    5/1995    Staudinger et al.
5,481,131 A    1/1996    Staudinger et al.
(Continued)

FOREIGN PATENT DOCUMENTS

JP    H04140909 A    5/1992
JP    H0653406 A    2/1994
(Continued)

OTHER PUBLICATIONS

International Search Report issued for PCT/JPP2016/080160, dated Dec. 27, 2016.
(Continued)

*Primary Examiner* — Rakesh B Patel
(74) *Attorney, Agent, or Firm* — Arent Fox LLP

(57) ABSTRACT

An LC composite electronic component includes a ceramic substrate that includes a magnetic layer, a thin-film insulator layer that is formed using a thin film process on a surface of the ceramic substrate, a coil-shaped inductor element that is formed in the ceramic substrate, a capacitor element that is formed in the thin-film insulator layer, and external terminals that are formed on a surface of the thin-film insulator layer. The capacitor element is located in the thin-film insulator layer and includes a first capacitor electrode, a second capacitor electrode and a thin-film dielectric body at least part of which is arranged between the first and second capacitor electrodes. The external terminals are each respectively connected to at least one out of the inductor element and the capacitor element.

15 Claims, 3 Drawing Sheets

(51) Int. Cl.
| | |
|---|---|
| *H01G 4/40* | (2006.01) |
| *H01F 27/28* | (2006.01) |
| *H01F 27/29* | (2006.01) |
| *H01F 27/40* | (2006.01) |
| *H01G 4/12* | (2006.01) |
| *H01G 4/224* | (2006.01) |
| *H01G 4/228* | (2006.01) |
| *H01G 4/33* | (2006.01) |
| *H01L 49/02* | (2006.01) |
| *H01F 17/00* | (2006.01) |
| *H01L 23/498* | (2006.01) |
| *H01L 27/01* | (2006.01) |
| *H05K 1/11* | (2006.01) |
| *H05K 1/18* | (2006.01) |

(52) U.S. Cl.
CPC ........... *H01F 27/292* (2013.01); *H01F 27/40* (2013.01); *H01G 4/1227* (2013.01); *H01G 4/224* (2013.01); *H01G 4/228* (2013.01); *H01G 4/33* (2013.01); *H01G 4/40* (2013.01); *H01L 23/49822* (2013.01); *H01L 28/10* (2013.01); *H01L 28/40* (2013.01); *H03H 1/00* (2013.01); *H01F 2017/0026* (2013.01); *H01L 27/016* (2013.01); *H03H 2001/0057* (2013.01); *H03H 2001/0085* (2013.01); *H05K 1/111* (2013.01); *H05K 1/181* (2013.01); *H05K 2201/1003* (2013.01); *H05K 2201/1006* (2013.01); *H05K 2201/10015* (2013.01)

(58) Field of Classification Search
USPC ................................................ 333/175, 185
See application file for complete search history.

(56) References Cited

U.S. PATENT DOCUMENTS

| | | |
|---|---|---|
| 5,643,804 A | 7/1997 | Arai et al. |
| 5,877,533 A | 3/1999 | Arai et al. |
| 6,410,960 B1 | 6/2002 | Arai et al. |
| 2002/0171510 A1* | 11/2002 | Kushitani ................ H03H 7/09 333/177 |
| 2007/0248802 A1 | 10/2007 | Saito et al. |
| 2008/0253056 A1 | 10/2008 | Leidl et al. |
| 2009/0134953 A1* | 5/2009 | Hunt ...................... H01P 1/184 333/168 |
| 2015/0371781 A1* | 12/2015 | Choi ........................ H01G 4/40 361/767 |

FOREIGN PATENT DOCUMENTS

| | | |
|---|---|---|
| JP | H0745785 A | 2/1995 |
| JP | H0786523 A | 3/1995 |
| JP | H09213894 A | 8/1997 |
| JP | H1167587 A | 3/1999 |
| JP | 2001044778 A | 2/2001 |
| JP | 2001223301 A | 8/2001 |
| JP | 2003318272 A | 11/2003 |
| JP | 2006311203 A | 11/2006 |
| JP | 2009508340 A | 2/2009 |
| JP | 2013172075 A | 9/2013 |
| WO | 2006040941 A1 | 4/2006 |

OTHER PUBLICATIONS

Written Opinion of the International Searching Authority issued for PCT/JP2016/080160, dated Dec. 27, 2016.

* cited by examiner

LC COMPOSITE ELECTRONIC COMPONENT, AND MOUNTING STRUCTURE FOR LC COMPOSITE ELECTRONIC COMPONENT

CROSS REFERENCE TO RELATED APPLICATIONS

The present application is a continuation of International application No. PCT/JP2016/080160, filed Oct. 12, 2016, which claims priority to Japanese Patent Application No. 2015-204732, filed Oct. 16, 2015, the entire contents of each of which are incorporated herein by reference.

TECHNICAL FIELD

The present invention relates to an LC composite electronic component, and particularly relates to an LC composite electronic component that, for example, includes a ceramic substrate in which an inductor element is formed, and a thin-film insulator layer in which a capacitor element is formed. Furthermore, the present invention particularly relates to a mounting structure for mounting the LC composite electronic component on a mounting substrate, for example.

BACKGROUND ART

Heretofore, as integrated passive devices (IPDs), various LC composite electronic components have been proposed in which capacitors and inductors are formed using thin film processes on a semiconductor substrate Japanese Unexamined Patent Application Publication No. 6-53406.

When a capacitor is formed using a thin film process, it is easy to form a capacitor having a large capacitance due to the fact that the distance between the capacitor electrodes can be made small. However, when an inductor is formed using a thin film process, it is difficult to make the film thicknesses of inductor conductor patterns large, and therefore in particular the direct-current resistance (DCR) of the inductor is undesirably increased. Consequently, it is difficult to form an inductor having a high Q value using a thin film process, and it is difficult to form an LC resonance circuit that has low loss in a high-frequency band in an LC composite electronic component formed using a thin film process.

On the other hand, Japanese Unexamined Patent Application Publication No. 11-67587, an LC composite electronic component having a structure in which a dielectric ceramic substrate in which a capacitor is formed and a magnetic ceramic substrate in which an inductor is formed are stacked on top of one another.

When a capacitor is formed in a dielectric ceramic substrate as in Japanese Unexamined Patent Application Publication No. 11-67587, it is difficult to make the distance between the capacitor electrodes small, and therefore it is difficult to form a capacitor having a large capacitance.

Furthermore, in the case where external terminals for realizing connections to the outside are formed on the surface of the ceramic substrate, the contraction rates and contraction behaviors of the material forming the ceramic substrate and the material of terminals at the time of firing greatly differ from each other, and therefore it is difficult to obtain high adhesion strength between the ceramic substrate and the external terminals. Therefore, when the LC composite electronic component is mounted on a mounting substrate, the LC composite electronic component is liable to fall off the mounting substrate. In addition, since the adhesion strength between the ceramic substrate and the external terminals is low, microscopic gaps are liable to form along the interfaces between the ceramic substrate and the external terminals. Therefore, there is a risk of electrochemical migration occurring due moisture infiltrating from the outside into the inside of the LC composite electronic component through the gaps and of electrical shorts occurring between the conductors formed inside the ceramic substrate and between the external terminals.

An object of the present invention is to provide an LC composite electronic component that is equipped with external terminals having high reliability and that has excellent high-frequency characteristics. Another object of the present invention is to use the LC composite electronic component to provide an LC composite electronic component mounting substrate in which the reliability of connections between the LC composite electronic component and a mounting substrate is increased.

BRIEF SUMMARY OF THE INVENTION (1) An LC composite electronic component of the present invention includes:
  a ceramic substrate that includes a magnetic layer;
  a thin-film insulator layer that is formed using a thin film process on a surface of the ceramic substrate, and includes a first capacitor electrode, a second capacitor electrode that is closer to the ceramic substrate than the first capacitor electrode, and a thin-film dielectric body;
  a coil-shaped inductor element that is formed in the ceramic substrate;
  a capacitor element that is formed in the thin-film insulator layer; and
  external terminals that are formed on a surface of the thin-film insulator layer, and are each connected to at least one out of the inductor element and the capacitor element.

The capacitor element is formed of the first capacitor electrode, the second capacitor electrode, and the thin-film dielectric body, at least part of the thin-film dielectric body being arranged between the first capacitor electrode and the second capacitor electrode.

Due to this configuration, it is easy to make the film thicknesses of coil conductor patterns constituting the inductor element large, and an inductor element in which direct-current resistance (DCR) is suppressed is readily formed. Therefore, an inductor element having a high Q value is readily formed, and a thin LC composite electronic component having an LC circuit (in particular, an LC resonance circuit) having small loss in a high-frequency band can be realized.

In addition, in this configuration, the external terminals are formed on the surface of the thin-film insulator layer formed using a thin film process, and therefore peeling off of the external terminals due to the manufacturing process is unlikely to occur and microscopic gaps between the element body and the external terminals are unlikely to be generated. Therefore, compared with a case where the external terminals are formed on the surface of the ceramic substrate using a co-firing technique, the adhesive strength between the external terminals and the thin-film insulator layer is high and microscopic gaps are unlikely to be formed along the interfaces between the external terminals and the thin-film insulator layer. Therefore, electrochemical migration caused by infiltration of moisture (for example, the plating liquid used when barrel plating is performed to plate the external terminals) from the outside into the inside of the LC composite electronic component through such gaps is suppressed, and short circuits occurring between conductor patterns formed inside the LC composite electronic component and between the external terminals are suppressed.

(2) In (1) described above, the thin-film dielectric body is preferably a barium strontium titanate sintered body. In this configuration, the ceramic substrate is formed by being fired at a temperature greater than or equal to 800° C., and therefore degradation of the characteristics of the inductor element formed in the ceramic substrate is suppressed even when the thin-film insulator layer (thin-film dielectric body) is fired at temperature in the vicinity of 700° C.

(3) In (1) or (2) described above, at least part of the thin-film dielectric body is preferably formed between the second capacitor electrode and the magnetic layer. With this configuration, generally, when a conductor pattern such as an electrodes is formed on the surface of a magnetic body in the case where a coil-shaped inductor element has been formed inside the magnetic body, the magnetic field generated by the inductor element is affected by the conductor pattern, and the Q value of the inductor element tends to be lowered. However, in this embodiment, the inductor element and the capacitor element are magnetically isolated from each other due to the thin-film dielectric body, which has low magnetic permeability, being interposed between the second capacitor electrode and the magnetic layer, which has high magnetic permeability. Therefore, the situation in which the magnetic field generated by the inductor element is affected by the capacitor element is suppressed, and lowering of the Q value of the inductor element can be suppressed.

(4) In any one of (1) to (3) described above, the thin-film insulator layer preferably further includes an insulating resin layer, the capacitor element is preferably covered by the insulating resin layer, and the external terminals are preferably formed on a surface of the insulating resin layer. With this configuration, the capacitor element can be protected from external forces and the like, and an LC composite electronic component having high robustness can be realized. In addition, in the case where the thin-film dielectric body is a material having low moisture resistance, changes in the characteristics of the thin-film dielectric body caused by moisture in the atmosphere are suppressed as a result of the entirety of the thin-film dielectric body being covered by the insulating resin layer.

(5) In any of (1) to (4) described above, a low pass filter may be formed of the inductor element and the capacitor element.

(6) A mounting structure for mounting an LC composite electronic component on a mounting substrate of the present invention, includes:

an LC composite electronic component having external terminals; and a mounting substrate having mounting terminals.

The external terminals are connected to the mounting terminals.

The LC composite electronic component further includes a ceramic substrate that includes a magnetic layer, a thin-film insulator layer that is formed using a thin film process on a surface of the ceramic substrate, and includes a first capacitor electrode, a second capacitor electrode that is closer to the ceramic substrate than the first capacitor electrode, and a thin-film dielectric body, a coil-shaped inductor element that is formed in the ceramic substrate, and a capacitor element that is formed in the thin-film insulator layer, The external terminals are formed on a surface of the thin-film insulator layer, and are each connected to at least one out of the inductor element and the capacitor element, and the capacitor element is formed of the first capacitor electrode, the second capacitor electrode, and the thin-film dielectric body, at least part of the thin-film dielectric body being arranged between the first capacitor electrode and the second capacitor electrode.

With this configuration, a wiring path between the capacitor element and the mounting substrate can be shortened, and therefore the parasitic inductance of the capacitor element is reduced and an LC composite electronic component having excellent high-frequency characteristics can be realized.

According to the present invention, an LC composite electronic component can be realized that is equipped with external terminals having high reliability and that has excellent high-frequency characteristics. Furthermore, by using the LC composite electronic component, an LC composite electronic component mounting substrate can be realized in which the reliability of connections between an LC composite electronic component and a mounting substrate is increased.

DESCRIPTION OF THE PREFERRED EMBODIMENTS

First Embodiment

Figure 1:
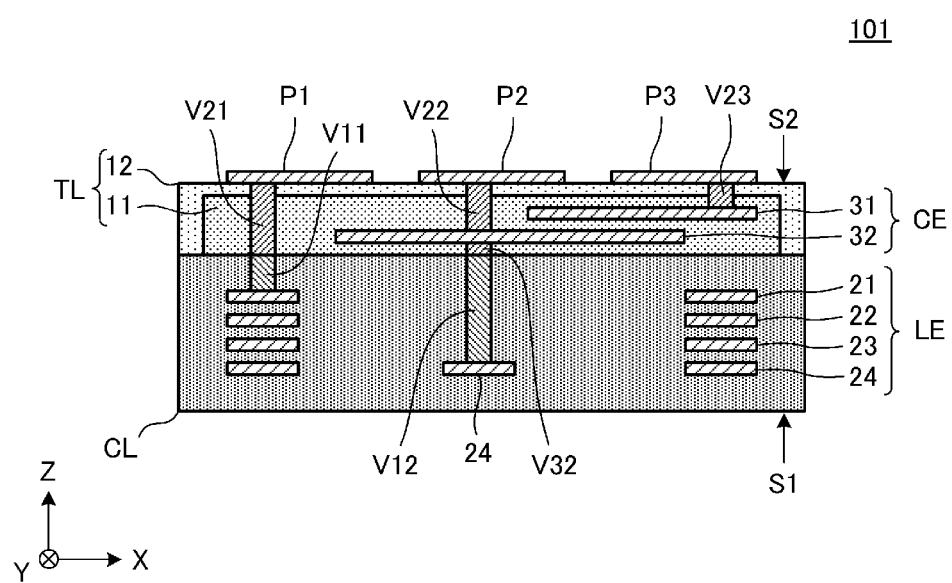
FIG. 1 is a sectional view of an LC composite electronic component 101 according to a first embodiment.
Figure 2:
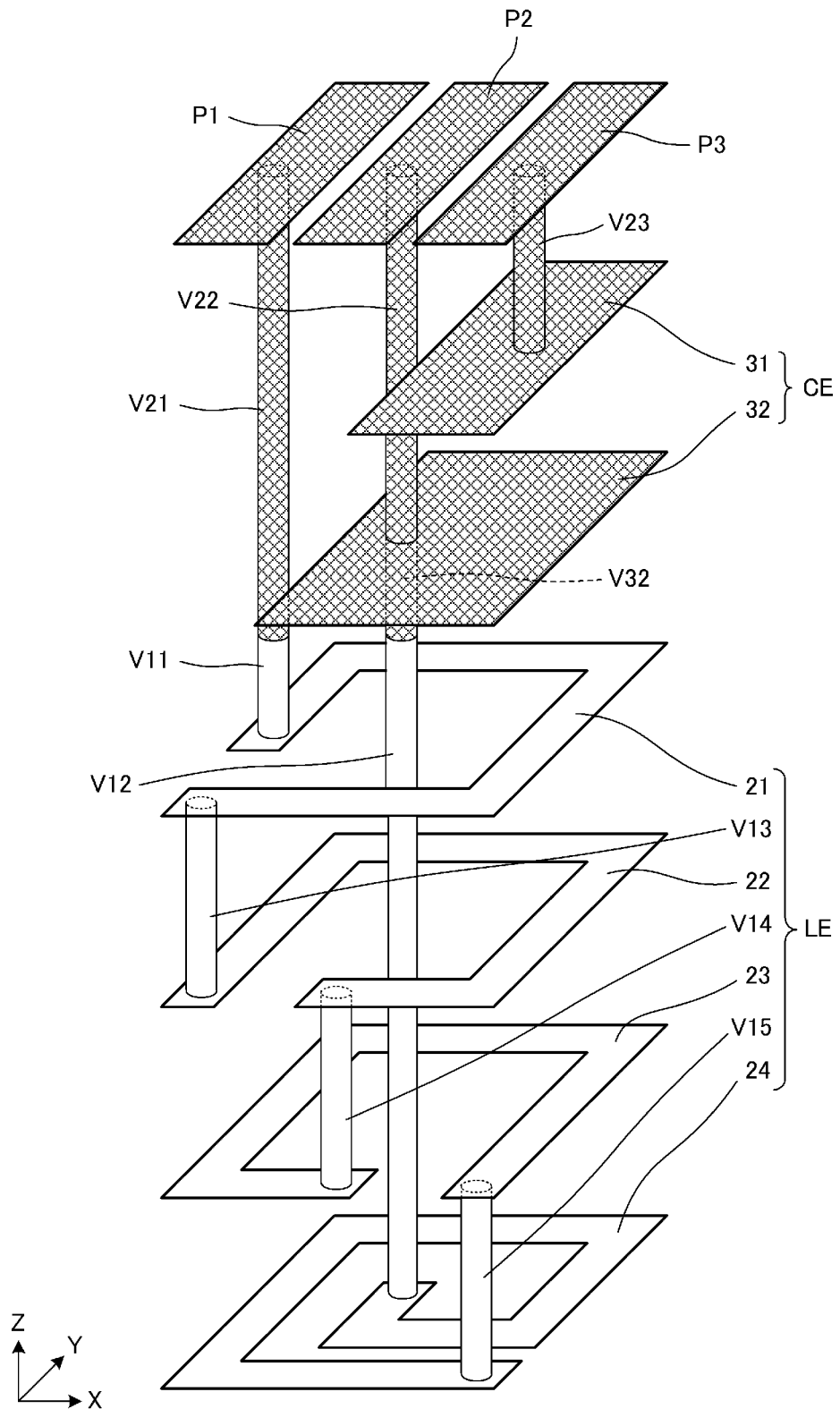
FIG. 2 is an external perspective view illustrating conductor patterns and external terminals P1, P2, and P3 of the LC composite electronic component 101.

Referring now to the drawing where like numerals indicate like elements, there is shown in FIGS. 1 and 2 a first exemplary embodiment of the invention. In FIG. 1, the thickness of each part is illustrated in an exaggerated manner. This is also true for the sectional views referred to in all the embodiments hereafter. The LC composite electronic component 101 is a surface-mount-type electronic component that includes inductive and capacitive elements, and is mounted on a mounting substrate.

The LC composite electronic component 101 includes a ceramic substrate CL having a first main surface S1, an inductor element LE embedded therein, a thin-film insulator layer TL having a second main surface S2 (which is preferably parallel to and spaced apart from the first main surface S1), a capacitor element CE, and external terminals P1, P2, and P3. In the present specification, the first main surface S1 is sometimes referred to as a "top surface" and the second main surface S2 is sometimes referred to as a "mounting surface".

The ceramic substrate CL is preferably a rectangular-parallelepiped-shaped magnetic flat plate formed by stacking a plurality of magnetic layers on top of one another, and includes coil conductor patterns 21, 22, 23, and 24 and interlayer connection conductors V11, V12, V13, V14, and V15. The magnetic layers are for example magnetic ferrite ceramic layers formed by sintering a ferrite ceramic powder.

The inductor element LE is preferably a helical-coil-shaped conductor formed inside the ceramic substrate CL and is formed of the coil conductor patterns 21, 22, 23, and 24 and the interlayer connection conductor V13, V14, and V15. The inductor element LE has a winding axis that extends in the stacking direction (the Z direction of FIG. 1). The coil conductor patterns 21, 22, 23, and 24 and the interlayer connection conductors V11, V12, V13, V14, and V15 are, for example, sintered films composed of a conductive paste containing a metal powder having Ag or the like as a main component.

As best shown in FIG. 2, a first end of the coil conductor pattern 21 is connected to a first end of the coil conductor pattern 22 via the interlayer connection conductor V13. A second end of the coil conductor pattern 22 is connected to a first end of the coil conductor pattern 23 via the interlayer connection conductor V14. A second end of the coil conductor pattern 23 is connected to a first end of the coil conductor pattern 24 via the interlayer connection conductor V15.

The thin-film insulator layer TL is preferably a re-wiring layer that is composed of a non-magnetic insulator layer formed using a thin film process on one surface of the ceramic substrate CL (the surface of the ceramic substrate which opposes the first main surface S1), and includes a thin-film dielectric body 11, an insulating resin layer 12, a first capacitor electrode 31, a second capacitor electrode 32, and interlayer connection conductors V21, V22, V23, and V32. The thin-film dielectric body 11 is preferably composed of a high permittivity material having a permittivity greater than or equal to 30 and is for example a ferroelectric layer composed of a barium strontium titanate ((Bax,Sr1-x)TiO3: hereafter, "BST") sintered body. In addition, the thin-film dielectric body 11 may be a ferroelectric layer composed of strontium titanate (SrTiO3: "STO") or the like, for example. The insulating resin layer 12 is preferably composed of a polyimide resin or an epoxy resin, for example. The interlayer connection conductors V21, V22, V23, and V32 are conductors such as Pt or Au.

The external terminals P1, P2, and P3 are preferably land grid array (LGA) terminals for facilitating mounting of the LC composite electronic component 101 on a mounting substrate (not shown), and are preferably formed in island-like shapes on the second main surface S2 of the thin-film insulator layer TL. The external terminals P1, P2, and P3 are preferably obtained by covering Cu with plating films of Ni and Au, for example. In this embodiment, the external terminal P3 is connected to ground.

The capacitor element CE is formed inside the thin-film insulator layer TL, and is preferably formed of the first capacitor electrode 31 and the second capacitor electrode 32 which are arranged to face each other with part of the thin-film dielectric body 11 located between the first and second capacitor electrodes 31 and 32. As illustrated in FIG. 1, the capacitor element CE is covered by the insulating resin layer 12.

The thin-film dielectric body 11 is formed on one surface of the ceramic substrate CL and the first capacitor electrode 31 and the second capacitor electrode 32 are arranged inside the thin-film dielectric body 11. As illustrated in FIG. 1, the second capacitor electrode 32 is arranged closer to the ceramic substrate CL than the first capacitor electrode 31. The second capacitor electrode 32 is spaced from the surface of the ceramic substrate CL with part of the thin-film dielectric body 11 being arranged between the second capacitor electrode 32 and the ceramic substrate CL (magnetic body). This part of the thin-film dielectric body 11 functions as an adhesive layer between the ceramic substrate CL and the second capacitor electrode 32. Since the thin-film dielectric body 11 according to this embodiment is preferably a BST sintered body having low moisture resistance, the entirety of the thin-film dielectric body 11 is preferably covered by the insulating resin layer 12 so as not to be exposed to the atmosphere. The external terminals P1, P2, and P3 are preferably formed on the second main surface S2 of the insulating resin layer 12.

In the embodiment illustrated in FIG. 2, the external terminal P1 is connected to a second end of the coil conductor pattern 21 via the interlayer connection conductors V11 and V21. The external terminal P2 is connected to the second capacitor electrode 32 via the interlayer connection conductors V22 and V32, and the second capacitor electrode 32 is connected to a second end of the coil conductor pattern 24 via the interlayer connection conductors V12 and V32. The external terminal P3 is connected to the first capacitor electrode 31 via the interlayer connection conductor V23.

Figure 3:
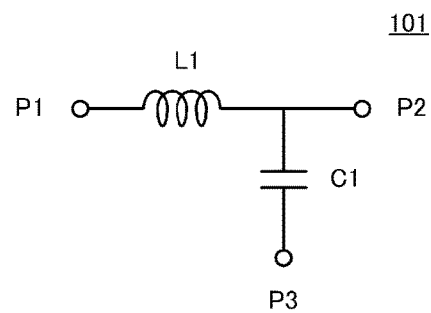
FIG. 3 is a circuit diagram of the LC composite electronic component 101.

FIG. 3 is a circuit diagram of the LC composite electronic component 101. In FIG. 3, the inductor element LE is illustrated as an inductor L1 and the capacitor element CE is illustrated as a capacitor C1.

As illustrated in FIG. 3, the LC composite electronic component 101 is a circuit in which the inductor L1 is connected between the external terminals P1 and P2 and the capacitor C1 is connected between the external terminals P2 and P3. The external terminal P1 is connected to a first end of the inductor L1, the external terminal P2 is connected to a second end of the inductor L1 and a first end of the capacitor C1, and the external terminal P3 is connected to a second end of the capacitor C1.

In this embodiment, the external terminal P3 is connected to ground. Therefore, in this embodiment, a low pass filter is formed by the inductor element LE and the capacitor element CE. As used herein, low pass filter means a filter which filters a frequency under 500 MHz.

The LC composite electronic component 101 is preferably manufactured using the materials and process described in (1) to (7) hereafter, for example.

(1) First, the ceramic substrate CL in which the inductor element LE is formed is prepared. The ceramic substrate CL is obtained by stacking a plurality of magnetic layers one on top of the other with the coil conductor patterns and interlayer connection conductors (composed of a conductive paste such as Ag) being formed on and extending through the layers, pressure bonding the stacked magnetic layers, and then firing the resulting body at a temperature greater than or equal to 800° C. The magnetic layers are green sheets composed of magnetic ferrite, for example.

(2) Next, one surface of the ceramic substrate CL is polished, and then a first sintered thin film is formed on that surface. In the case where the first sintered thin film is formed of BST, a deposition raw material solution containing Ba, Sr, and Ti in a molar ratio of for example Ba:Sr:Ti=7:3:10 is prepared. Then, this deposition raw material solution is applied to the polished one surface of the ceramic substrate CL, dried using a hot plate, and then the solution is made to undergo crystallization by being subjected to a heat treatment, and thus the first sintered thin film is formed. After that, openings for the interlayer connection conductors V21 and V32 are formed in the first sintered thin film.

The temperature of the hot plate is not particularly limited so long as the desired drying characteristics are obtained, but the temperature is preferably set to be within the range of 300-400° C. In addition, the temperature of the heat treatment is not particularly limited so long as desired crystallization takes place, but is preferably set to be within a range of 600-700° C. (in the vicinity of 700° C.). In addition, the duration of the heat treatment is not particularly limited so long as desired crystallization takes place, but is preferably set to be within a range from 10 to 60 minutes.

(3) Next, the second capacitor electrode 32 and the interlayer connection conductor V32 are formed on and in the first sintered thin film. Specifically, the second capacitor electrode 32 and the interlayer connection conductor V32 and so on composed of Pt or Au are formed using an RF magnetron sputtering technique.

(4) Next, a BST film that constitutes a second sintered thin film is formed on the surfaces of the first sintered thin film and the second capacitor electrode 32, the first capacitor electrode 31 and so on are formed, and a BST film that constitutes a third sintered thin film is formed on the surfaces of the second sintered thin film and the first capacitor electrode 31. The thin-film dielectric body 11 is formed by the first sintered thin film, the second sintered thin film, and the third sintered thin film.

(5) After that, the entirety of the thin-film dielectric body 11 is covered with the insulating resin layer 12. The insulating resin layer 12 is composed of a polyimide resin or an epoxy resin, for example.

(6) Next, openings for the interlayer connection conductors are formed in the first sintered thin film, the second sintered thin film, and the third sintered thin film, and the interlayer connection conductors V21, V22, and V23 and the external terminals P1, P2, and P3 are formed using conductor patterns composed of Cu or the like using an RF magnetron sputtering technique. In addition, Ni and Au plating films may be formed on the surfaces of the external terminals P1, P2, and P3.

(7) The above-described steps may be performed in a wafer state in which a plurality of the LC composite electronic components 101 are formed. Finally, the wafer is cut with a dicing machine and divided into individual LC composite electronic component 101 units (individual pieces).

Figure 4:
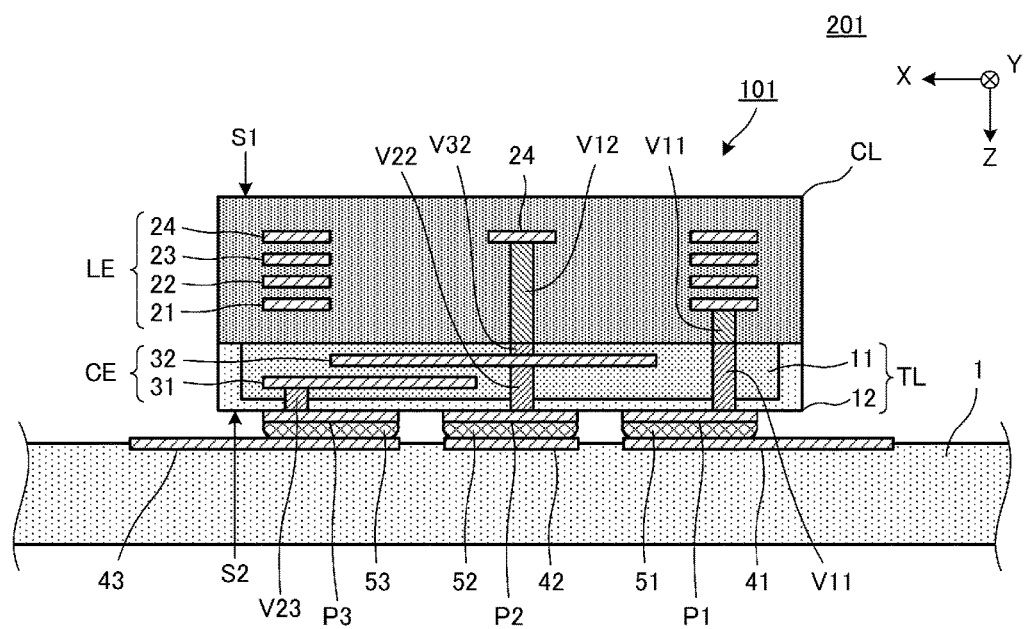
FIG. 4 is a sectional view illustrating a state in which the LC composite electronic component 101 is mounted on a mounting substrate 1.

FIG. 4 is a sectional view illustrating a state in which the LC composite electronic component 101 is mounted on a mounting substrate 1.

A plurality of mounting terminals 41, 42, and 43 are formed on the upper surface of the mounting substrate 1 (i.e., the lower surface as viewed in FIG. 4). The LC composite electronic component 101 is mounted on the mounting substrate 1 with the thin-film insulator layer TL side of the LC composite electronic component 101 serving as a mounting surface. The mounting substrate 1 is, for example, a printed wiring board.

The external terminal P1 is connected to the mounting terminal 41 of the mounting substrate 1 via conductive bonding material 51, the external terminal P2 is connected to the mounting terminal 42 of the mounting substrate 1 via conductive bonding material 52, and the external terminal P3 is connected to the mounting terminal 43 of the mounting substrate 1 via conductive bonding material 53. The conductive members 51, 52, and 53 are composed of solder, for example.

The LC composite electronic component 101 according to this embodiment exhibits the following effects.

(a) In the LC composite electronic component 101 according to this embodiment, a coil-shaped inductor element LE is formed in the ceramic substrate CL, which includes a magnetic layer. With this configuration, it is easy to make the film thicknesses of the coil conductor patterns 21, 22, 23, and 24 constituting the inductor element LE large, and an inductor element LE in which direct-current resistance (DCR) is suppressed is easily formed. Therefore, an inductor element LE having a high Q value is easily formed, and a thin LC composite electronic component 101 having an LC circuit (in particular, an LC resonance circuit) having small loss in a high-frequency band can be realized.

(b) In the LC composite electronic component 101, the input/output-terminal external terminals P1, P2, and P3 are formed on the surface of the insulating resin layer 12 (thin film insulator layer TL). Due to this configuration, the external terminals P1, P2, and P3 are formed on the surface of the thin-film insulator layer TL, which is formed using a thin film process, and therefore peeling off of the external terminals P1, P2, and P3 due to the manufacturing process is unlikely to occur and microscopic gaps between the element body and the external terminals P1, P2, and P3 are unlikely to be generated. Therefore, compared with a case where the external terminals P1, P2, and P3 are formed on the surface of the ceramic substrate CL using a co-firing technique, the adhesive strength between the external terminals P1, P2, and P3 and the thin-film insulator layer TL is high and microscopic gaps are unlikely to be formed along the interfaces between the external terminals P1, P2, and P3 and the thin-film insulator layer TL. Therefore, electrochemical migration caused by infiltration of moisture (for example, the plating liquid used when barrel plating is performed to plate the external terminals) from the outside into the inside of the LC composite electronic component 101 through such gaps is suppressed, and short circuits between the conductor patterns formed inside the LC composite electronic component 101 and between the external terminals P1, P2, and P3 are suppressed.

In addition, a printed wiring board, such as the one constituting the mounting substrate 1, is generally formed of an epoxy resin or the like, and therefore compared with a case where the LC composite electronic component 101 is mounted on the mounting substrate 1 with the ceramic substrate CL side thereof serving as a mounting surface, the difference in thermal expansion coefficient between the mounting surface (second main surface S2) of the LC composite electronic component 101 and the mounting substrate 1 is small. Therefore, a situation in which the LC composite electronic component 101 falls off the mounting substrate 1 is suppressed, and disconnections and the like occurring in the places where the external terminals P1, P2, and P3 of the LC composite electronic component 101 and the mounting terminals 41, 42, and 43 of the mounting substrate 1 are connected to each other are suppressed.

(c) In the LC composite electronic component 101, the thin-film dielectric body 11, which is formed on the surface of the ceramic substrate CL, is preferably a BST sintered body. In this configuration, the ceramic substrate CL is formed by being fired at a temperature greater than or equal to 800° C., and therefore degradation of the characteristics of the inductor element LE formed in the ceramic substrate CL is suppressed even when the thin-film insulator layer TL (thin-film dielectric body 11) is fired at temperature in the vicinity of 700° C.

(d) In the LC composite electronic component 101, at least part of the thin-film dielectric body 11 is formed between the second capacitor electrode 32 and the ceramic substrate CL. Since both the thin-film dielectric body 11 and the ceramic substrate CL are sintered bodies, more specifically, metal oxide polycrystalline bodies, the material of the thin-film dielectric body has higher adhesion to the ceramic substrate CL than the electrode material. Therefore, high adhesion strength can be obtained between the thin-film insulator layer TL (thin-film dielectric body 11) and the ceramic substrate CL. In addition, since a BST sintered body, which constitutes the thin-film dielectric body 11, has good compatibility with Pt, which is the material constituting the second capacitor electrode 32, high adhesion strength can be obtained between the thin-film dielectric body 11 and the second capacitor electrode 32.

(e) In addition, in this embodiment, at least part of the thin-film dielectric body 11 is formed between the second capacitor electrode 32 and the magnetic layer of the ceramic substrate CL. Generally, when a conductor pattern such as an electrode is formed on the surface of a magnetic body in the case where a coil-shaped inductor element is formed inside a magnetic body, the magnetic field generated by the inductor element is affected by the conductor pattern (for example, an eddy current is generated or the conductor pattern contributes to radiation of a magnetic field), and the Q value of the inductor element tends to be lowered. In contrast, in this embodiment, the inductor element LE and the capacitor element CE are magnetically isolated from each other due to the thin-film dielectric body 11, which has low magnetic permeability, being interposed between the second capacitor electrode 32 and the magnetic layer, which has high magnetic permeability. Therefore, the situation in which the magnetic field generated by the inductor element LE is affected by the capacitor element CE is suppressed, and lowering of the Q value of the inductor element LE can be suppressed.

(f) The LC composite electronic component 101 includes the insulating resin layer 12, and the capacitor element CE is covered by the insulating resin layer 12. Due to this configuration, the capacitor element CE can be protected from external forces and the like, and an LC composite electronic component 101 having high robustness can be realized. In addition, in the case where the thin-film dielectric body 11 is a BST sintered body having low moisture resistance as in this embodiment, changes in the characteristics of the thin-film dielectric body 11 caused by moisture in the atmosphere are suppressed as a result of the entirety of the thin-film dielectric body 11 being covered by the insulating resin layer 12. The insulating resin layer 12 is not essential to the LC composite electronic component 101, and the external terminals P1, P2, and P3 may instead be formed on the surface of the thin-film dielectric body 11. However, as described above, it is preferable that the LC composite electronic component 101 include the insulating resin layer 12 and that the capacitor element CE and the thin-film dielectric body 11 be covered by the insulating resin layer 12.

(g) In addition, the LC composite electronic component 101 is mounted on the mounting substrate 1 with the thin-film insulator layer TL side of the LC composite electronic component 101, where the capacitor element CE is formed, serving as a mounting surface. Due to this configuration, a wiring path between the capacitor element CE and the mounting substrate 1 can be shortened, and therefore the parasitic inductance of the capacitor element CE is reduced and an LC composite electronic component 101 having excellent high-frequency characteristics can be realized. Furthermore, in the case where a low pass filter is formed of the inductor element LE and the capacitor element CE as in this embodiment, if a large parasitic inductance is applied to the shunt-connected capacitor element CE, an unwanted pole is generated and the desired low pass filter function is not realized. Therefore, the configuration described in this embodiment is particularly useful when forming a low pass filter using the inductor element LE and the capacitor element CE.

Other Embodiments

In the above-described embodiment, an example is described in which the shape of the ceramic substrate CL in plan view is a rectangular parallelepiped shape, but the present invention is not limited to this configuration. The shape of the ceramic substrate CL can be changed as appropriate within the range in which the action/effect of the present invention is exhibited, and for example, the ceramic substrate CL may be a flat plate having a square shape, a polygonal shape, a circular shape, an elliptical shape, an L shape, a T shape, or the like in plan view.

Furthermore, in the above-described embodiment, an example is described in which the ceramic substrate CL is a magnetic flat plate formed by stacking a plurality of magnetic layers on top of one another, but the present invention is not limited to this configuration. It is sufficient that a magnetic layer be included in part of the ceramic substrate CL. In other words, provided that a magnetic layer is included in part of the ceramic substrate CL, the outermost layers in the stacking direction may be non-magnetic layers and layers on the inside in the stacking direction may be non-magnetic layers.

The number of layers of the ceramic substrate CL can be changed as appropriate, and the ceramic substrate CL may be a single-layer magnetic flat plate, for example. In addition, in the above-described embodiment, an example is described in which the inductor element LE is a helical coil-shaped conductor having approximately four turns, but the present invention is not limited to this configuration. The number of turns of the inductor element LE can be changed as appropriate, and may be less than or equal to one turn, for example. In addition, the inductor element LE may be a spiral-coil-shaped conductor.

In the above-described embodiment, an example is described in which a structure is adopted in which the winding axis of the inductor element LE extends in the stacking direction (Z direction) of the plurality of magnetic layers, but the present invention is not limited to this configuration. A structure may instead be adopted in which the winding axis of the inductor element LE extends in a direction orthogonal to the Z direction (for example, in X direction or Y direction). With this configuration, a situation in which magnetic flux generated by the inductor element LE is disturbed by the capacitor element CE can be suppressed.

In addition, in the above-described embodiment, an example is described in which a low pass filter is formed by the inductor element LE and the capacitor element CE, but the present invention is not limited to this configuration. The circuit configuration of the LC composite electronic component can be changed as appropriate, and for example, a high pass filter may be formed, a circuit in which the inductor element LE and the capacitor element CE are connected in series with each other, a 7*c*-type circuit, a T-type circuit and so on may be formed. Furthermore, the LC composite electronic component is not limited to being provided with only one inductor element LE and only one capacitor element CE. A plurality of each of the inductor element LE and the capacitor element CE may be provided, and the numbers of the inductor element LE and the capacitor element CE can be changed as appropriate depending on the circuit configuration of the LC composite electronic component.

In the above-described embodiment, an LC composite electronic component 101 is described that is equipped with rectangular external terminals P1, P2, and P3, but the present invention is not limited to this configuration. The number of external terminals can be changed as appropriate depending on the circuit configuration of the LC composite electronic component. Furthermore, the shapes of the external terminals can also be changed as appropriate, and may be polygonal, circular, elliptical, L-shaped, or T-shaped, for example.

REFERENCE SIGNS LIST

LE . . . inductor element
CE . . . capacitor element
CL . . . ceramic substrate
TL . . . thin-film insulator layer
P1, P2, P3 . . . external terminal
S1 . . . first main surface
S2 . . . second main surface
V11, V12, V13, V14, V15, V21, V22, V23, V32 . . . interlayer connection conductor
1 . . . mounting substrate
11 . . . thin-film dielectric body
12 . . . insulating resin layer
21, 22, 23, 24 . . . coil conductor pattern
31 . . . first capacitor electrode
32 . . . second capacitor electrode
41, 42, 43 . . . mounting terminal
51, 52, 53 . . . conductive bonding material
101 . . . LC composite electronic component

The invention claimed is:

1. An LC composite electronic component, comprising:
   (a) a ceramic substrate that includes:
       (i) a magnetic layer; and
       (ii) an inductor element that is coil-shaped and is formed at least partly in the ceramic substrate;
   (b) a thin-film insulator layer located on a surface of the ceramic substrate, the thin-film insulating layer including a capacitor element that comprises:
       (i) a first capacitor electrode;
       (ii) a second capacitor electrode located closer to the ceramic substrate than the first capacitor electrode;
       (iii) a thin-film dielectric body at least part of which is located between the first and second capacitor electrodes; and
       (iv) an insulating resin layer which covers the capacitor element and has an exposed outer surface; and
   (c) external terminals located on the outer surface of the insulating resin layer, each respective external terminal being connected to the inductor element and/or the capacitor element.

2. The LC composite electronic component according to claim 1, wherein the thin-film dielectric body is a barium strontium titanate sintered body.

3. The LC composite electronic component according to claim 2, wherein at least part of the thin-film dielectric body is located between the second capacitor electrode and the magnetic layer.

4. The LC composite electronic component mounting structure according to claim 3, wherein the inductor element and the capacitor element form a low pass filter.

5. The LC composite electronic component according to claim 2, wherein the inductor element and the capacitor element form a low pass filter.

6. An LC composite electronic component mounting structure, comprising:
   an LC composite electronic component according to claim 1; and
   a mounting substrate having mounting terminals connected to the external terminals.

7. The LC composite electronic component mounting structure according to claim 6, wherein the thin-film dielectric body is a barium strontium titanate sintered body.

8. The LC composite electronic component mounting structure according to claim 7, wherein at least part of the thin-film dielectric body is located between the second capacitor electrode and the magnetic layer.

9. The LC composite electronic component according to claim 1, wherein the inductor element and the capacitor element form a low pass filter.

10. The LC composite electronic component according to claim 1, wherein at least part of the thin-film dielectric body is located between the second capacitor electrode and the magnetic layer.

11. The LC composite electronic component according to claim 10, wherein the inductor element and the capacitor element form a low pass filter.

12. The LC composite electronic component according to claim 1, wherein the thin-film insulating layer is formed directly on the ceramic substrate.

13. The LC composite electronic component according to claim 1, wherein the insulating resin layer is located on a portion of the thin film dielectric body that does not face the ceramic substrate.

14. The LC composite electronic component according to claim 1, wherein the thin film dielectric body has an outer surface a portion of which faces the ceramic substrate and the insulating resin layer covers the entire outer surface of the thin film dielectric body except the portion of the thin film dielectric body that faces the ceramic substrate.

15. The LC composite electronic component according to claim 1, wherein the inductor element is formed wholly in the ceramic substrate.

* * * * *